United States Patent
Nagashima et al.

(10) Patent No.: US 10,460,961 B2
(45) Date of Patent: Oct. 29, 2019

(54) SUBSTRATE PROCESSING APPARATUS

(71) Applicant: SHIBAURA MECHATRONICS CORPORATION, Yokohama-shi (JP)

(72) Inventors: Yuji Nagashima, Yokohama (JP); Konosuke Hayashi, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 96 days.

(21) Appl. No.: 15/720,928

(22) Filed: Sep. 29, 2017

(65) Prior Publication Data

US 2018/0096864 A1     Apr. 5, 2018

(30) Foreign Application Priority Data

Sep. 30, 2016    (JP) ................................ 2016-194722

(51) Int. Cl.
     *H01L 21/67*      (2006.01)
     *B08B 3/02*      (2006.01)
     (Continued)

(52) U.S. Cl.
     CPC .......... *H01L 21/67051* (2013.01); *B08B 3/02* (2013.01); *B08B 3/08* (2013.01);
     (Continued)

(58) Field of Classification Search
     CPC ......... H01L 21/67051; H01L 21/02052; H01L 21/67115; H01L 21/68764; B08B 3/02; B08B 3/08; B08B 5/02; F26B 3/30
     (Continued)

(56) References Cited

U.S. PATENT DOCUMENTS

| | | | | |
|---|---|---|---|---|
| 4,828,369 A | * | 5/1989 | Hotomi | ..................... G02F 1/15 118/723 IR |
| 4,846,926 A | * | 7/1989 | Kay | ........................ C30B 25/02 438/508 |

(Continued)

FOREIGN PATENT DOCUMENTS

| | | | | |
|---|---|---|---|---|
| EP | 2782129 A2 | * | 9/2014 | ......... H01L 21/6704 |
| EP | 2782129 A3 | * | 10/2014 | ......... H01L 21/6704 |

(Continued)

OTHER PUBLICATIONS

Taiwanese Office Action and Search Report dated Apr. 11, 2018 in Taiwanese Patent Application No. 106130930, with partial English Translation and English Translation of Category of Cited Documents, 7 pages.

*Primary Examiner* — Stephen M Gravini
(74) *Attorney, Agent, or Firm* — Oblon, McClelland, Maier & Neustadt, L.L.P.

(57) ABSTRACT

According to one embodiment, a substrate processing apparatus includes a processing chamber, a support part, a heater, and an optical member. In the processing chamber, air flows from the top to the bottom. The support part is located in the processing chamber to support a substrate having a surface to be treated. The heater is arranged so as not to be above the support part and emits light for heating. The optical member is arranged in the processing chamber so as not to be above the support part to guide the light emitted by the heater and having passed above the support part to the surface to be treated of the substrate supported by the support part.

13 Claims, 8 Drawing Sheets

(51) Int. Cl.
  *B08B 3/08* (2006.01)
  *B08B 5/02* (2006.01)
  *F26B 3/30* (2006.01)
  *H01L 21/02* (2006.01)
  *H01L 21/687* (2006.01)

(52) U.S. Cl.
  CPC .................. *B08B 5/02* (2013.01); *F26B 3/30* (2013.01); *H01L 21/02052* (2013.01); *H01L 21/67115* (2013.01); *H01L 21/68764* (2013.01)

(58) Field of Classification Search
  USPC .......................................................... 34/273
  See application file for complete search history.

(56) References Cited

U.S. PATENT DOCUMENTS

| | | | | |
|---|---|---|---|---|
| 5,242,537 | A * | 9/1993 | Nelson | H01L 37/02 204/298.36 |
| 7,353,623 | B2 * | 4/2008 | Asuke | F26B 11/18 34/381 |
| 7,484,315 | B2 * | 2/2009 | Suzuki | C23C 16/16 118/726 |
| 7,654,010 | B2 * | 2/2010 | Moriya | H01L 21/67017 118/65 |
| 7,797,855 | B2 * | 9/2010 | Fukuoka | C30B 33/02 118/709 |
| 8,205,352 | B2 * | 6/2012 | Lewis | H01L 21/67028 118/500 |
| 8,256,131 | B2 * | 9/2012 | Zakel | H01L 21/67034 134/1.3 |
| 8,677,650 | B2 * | 3/2014 | Watterodt | F26B 15/04 34/381 |
| 8,898,928 | B2 * | 12/2014 | Sirard | H01L 21/02057 34/284 |
| 8,898,930 | B2 * | 12/2014 | Godot | F26B 5/04 134/1 |
| 8,904,668 | B2 * | 12/2014 | Priebe | F26B 3/22 101/450.1 |
| 9,213,242 | B2 * | 12/2015 | Uozumi | G03F 7/162 |
| 9,536,797 | B2 * | 1/2017 | Igarashi | H01L 22/12 |
| 9,607,865 | B2 * | 3/2017 | Hayashi | H01L 21/67051 |
| 9,795,999 | B2 * | 10/2017 | Ootagaki | B08B 3/08 |
| 9,964,358 | B2 * | 5/2018 | Matsushita | H01L 21/67115 |
| 2002/0005400 | A1 | 1/2002 | Gat | |
| 2018/0104966 | A1 * | 4/2018 | Aoyagi | A61J 3/06 |

FOREIGN PATENT DOCUMENTS

| | | | | |
|---|---|---|---|---|
| EP | 3301707 A1 * | 4/2018 | | B08B 3/02 |
| JP | 2-237029 | 9/1990 | | |
| JP | 2-278720 A | 11/1990 | | |
| JP | 7-326578 A | 12/1995 | | |
| JP | 2004-14794 A | 1/2004 | | |
| JP | 2004-56070 A | 2/2004 | | |
| JP | 2008-128567 A | 6/2008 | | |
| KR | 20140114302 A * | 9/2014 | | H01L 21/6704 |
| KR | 10-2014-0137647 A | 12/2014 | | |

* cited by examiner

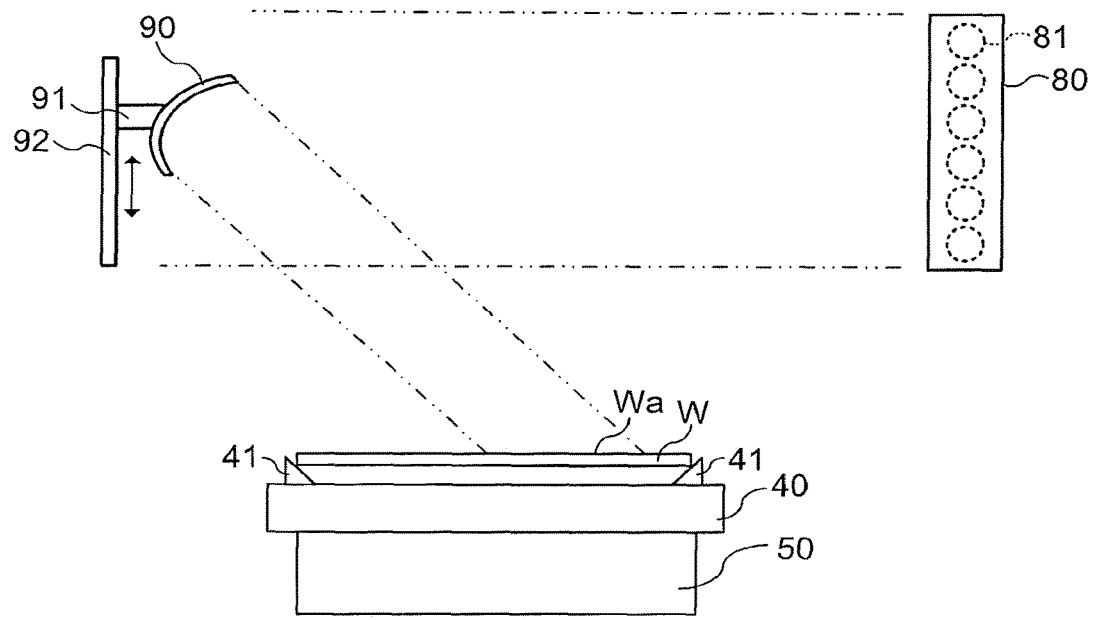
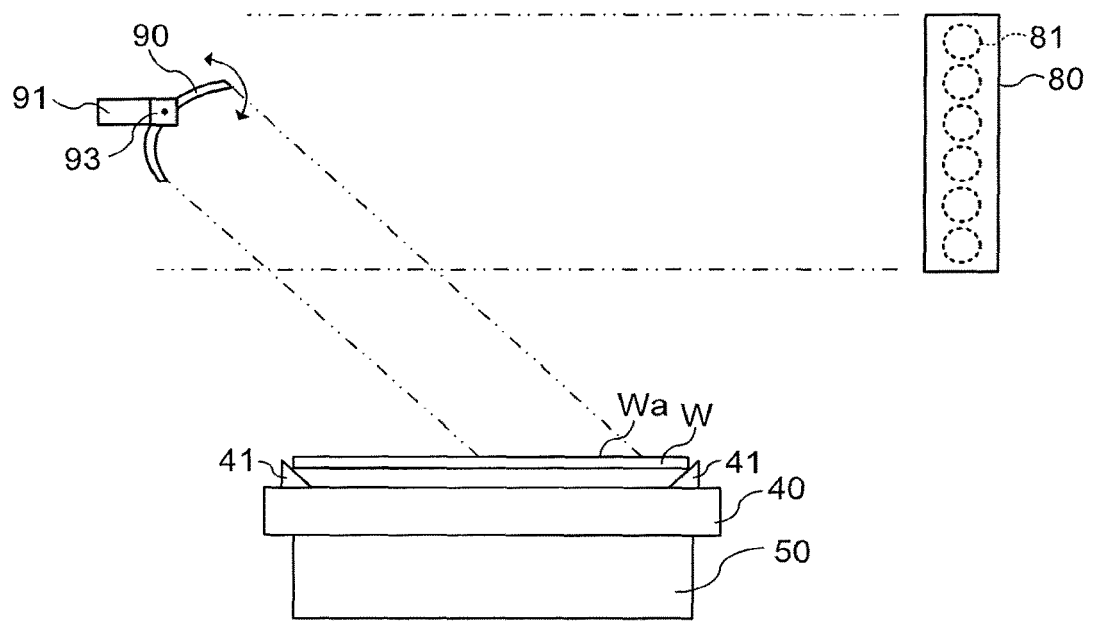

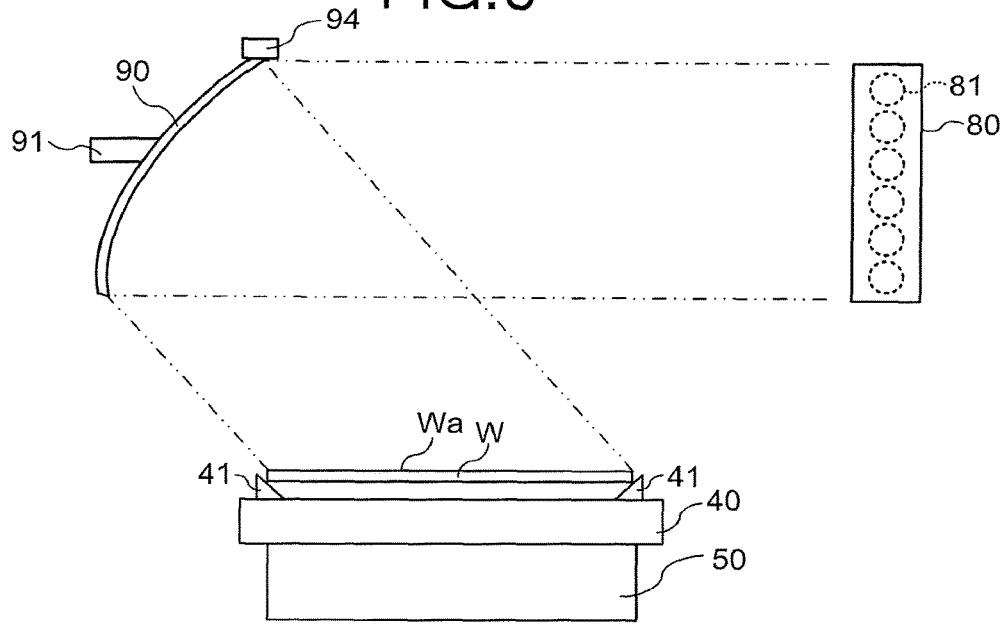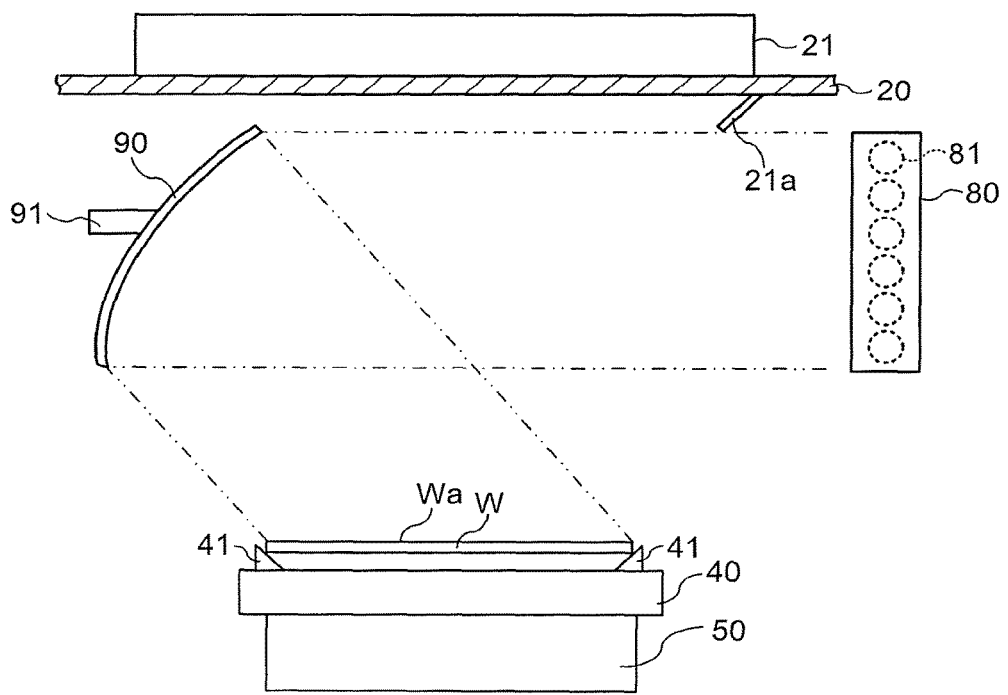

SUBSTRATE PROCESSING APPARATUS

CROSS-REFERENCE TO THE RELATED APPLICATION

This application is based upon and claims the benefit of priority from Japanese Patent Application No. 2016-194722, filed on Sep. 30, 2016; the entire contents of which are incorporated herein by reference.

FIELD

Embodiments described herein relate generally to a substrate processing apparatus.

BACKGROUND

A substrate processing apparatus is used in the process of manufacturing a semiconductor, a liquid crystal panel, or the like, to treat a surface to be treated of a substrate such as a wafer or a liquid crystal substrate with a chemical solution, rinse the surface after the chemical treatment with a rinsing liquid, and then dry the substrate after the rinsing.

In the drying process, problems such as pattern collapse around, for example, the memory cell or the gate have occurred due to recent miniaturization along with higher integration and higher capacity of semiconductors. This is caused by the spacing and structure between the patterns, the surface tension of the rinsing liquid, and the like.

Therefore, in order to suppress the pattern collapse, there has been proposed a substrate drying method using a volatile solvent (e.g., IPA: 2-propanol, isopropyl alcohol) with a surface tension smaller than that of the rinsing liquid (e.g., DIW: ultrapure water). In the substrate drying method, the substrate is dried by replacing the rinsing liquid on the treated surface of the substrate with a volatile solvent. At this time, to promote the drying, the substrate may be heated by a lamp located above the surface to be treated of the substrate to dry the substrate.

In the chemical treatment step, a high-temperature treatment of 150° C. or more may be performed using sulfuric acid or phosphoric acid as a chemical solution. In this case, the chemical solution is heated to 150° C. or higher to be used in the treatment. Therefore, the chemical solution on the surface to be treated of the substrate is heated to a high temperature of 150° C. or higher by the lamp located above the surface to be treated.

However, in the drying process and the chemical treatment process, since the lamp is located above the surface to be treated of the substrate, a mist or particles of the treatment liquid adhere(s) to the surface of the lamp during the substrate processing. The adhering matter such as a mist or particles of the treatment liquid drops from the surface of the lamp and adheres to the surface to be treated of the substrate. This may result in the contamination of the substrate.

Meanwhile, a common substrate processing apparatus is provided with an ultra-low penetration air (ULPA) filter or a high efficiency particulate air (HEPA) filter. The clean air that has passed through the filter flows in the substrate processing apparatus as downflow (vertical laminar flow), and the inside of the substrate processing apparatus is kept clean. As a result, particles are prevented from adhering to the inside of the substrate processing apparatus, in particular, the surface to be treated of the substrate.

However, in the aforementioned substrate processing apparatus, since the lamp is located above the surface to be treated of the substrate, clean air directed from the filter toward the surface to be treated of the substrate is interrupted by the lamp and is not sufficiently supplied to the surface to be treated of the substrate. For this reason, it is difficult to remove particles from the surface to be treated of the substrate and its surroundings. As a result, the substrate is contaminated.

BRIEF DESCRIPTION OF THE DRAWINGS

FIG. 6 is a schematic diagram illustrating a part of a substrate processing unit according to a third embodiment;

FIG. 7 is a schematic diagram illustrating a part of a substrate processing unit according to a fourth embodiment;

FIG. 8 is a schematic diagram illustrating a part of a substrate processing unit according to a fifth embodiment;

FIG. 9 is a schematic diagram illustrating a part of a substrate processing unit according to a sixth embodiment.

DETAILED DESCRIPTION

According to one embodiment, a substrate processing apparatus includes a processing chamber, a support part, a heater, and an optical member. In the processing chamber, air flows from the top to the bottom. The support part is located in the processing chamber to support a substrate having a surface to be treated. The heater is arranged so as not to be above the support part and emits light for heating. The optical member is arranged in the processing chamber so as not to be above the support part to guide the light emitted by the heater and having passed above the support part to the surface to be treated of the substrate supported by the support part.

Various Embodiments will be described hereinafter with reference to the accompanying drawings.

<First Embodiment>

A first embodiment will be described with reference to FIGS. 1 to 3.

(Basic Configuration)

Figure 1:
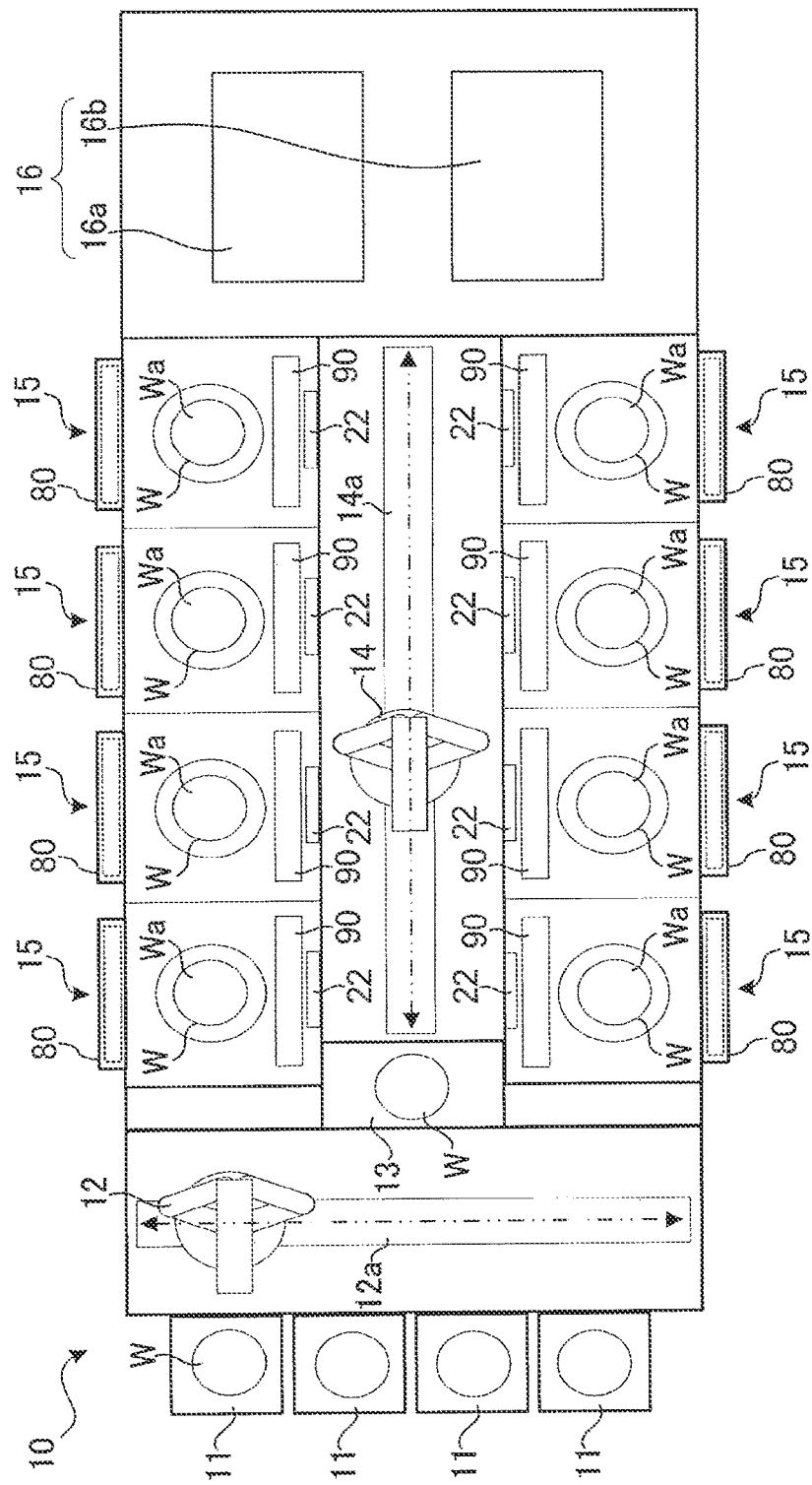
FIG. 1 is a schematic diagram illustrating a configuration of a substrate processing apparatus according to a first embodiment.

As illustrated in FIG. 1, a substrate processing apparatus 10 of the first embodiment includes a plurality of opening/closing units 11, a first transfer robot 12, a buffer unit 13, a second transfer robot 14, a plurality of substrate processing units 15, and an apparatus accessory unit 16.

The opening/closing units 11 are arranged in a row. The opening/closing units 11 are configured to open and close the door of a dedicated case (e.g., FOUP) functioning as a conveying container. If the dedicated case is FOUP, the opening/closing units 11 are called FOUP opener. The dedicated case houses substrates W that are stacked at predetermined intervals.

The first transfer robot 12 is located next to the row of the opening/closing units 11 so as to be movable along a rail 12a extending in the first transfer direction in which the opening/closing units 11 are arranged. The first transfer robot 12 takes out an unprocessed substrate W from the dedicated case, the door of which has been opened by the opening/closing units 11, and moves in the first transfer direction as necessary to bring it into the buffer unit 13. Besides, the first transfer robot 12 takes out a processed substrate W from the buffer unit 13, and moves in the first transfer direction as necessary to bring it into a desired dedicated case. As the first transfer robot 12, for example, a robot having a robot arm, a robot hand, a moving mechanism, or the like can be used.

The buffer unit 13 is located around the center of a first robot movement path in which the first transfer robot 12 moves, and is arranged on one side of the first robot movement path, i.e., on the side opposite to the opening/closing units 11. The buffer unit 13 functions as a buffer table (substrate transfer table) for exchanging the substrate W between the first transfer robot 12 and the second transfer robot 14. The buffer unit 13 stores the substrates W that are stacked at predetermined intervals.

The second transfer robot 14 is arranged so as to be movable along a rail 14a extending from the vicinity of the buffer unit 13 in the second transfer direction perpendicular to the first transfer direction (an example of a direction crossing the first transfer direction). The second transfer robot 14 takes out an unprocessed substrate W from the buffer unit 13, and moves along the second transfer direction as necessary to bring it into a desired one of the substrate processing units 15. In addition, the second transfer robot 14 takes out a processed substrate W from one of the substrate processing units 15, and moves in the second transfer direction as necessary to bring it into the buffer unit 13. As the second transfer robot 14, like the first transfer robot 12, for example, a robot having a robot arm, a robot hand, a moving mechanism or the like can be used.

For example, four substrate processing units 15 are arranged on each side of a second robot movement path in which the second transfer robot 14 moves. The substrate processing units 15 are configured to supply a chemical solution to a surface to be treated Wa of the substrate W such as a wafer or a liquid crystal substrate to treatment the surface, thereafter supply a rinsing liquid thereto to rinse the surface Wa, and dry the substrate W after the rinsing (details will be described later).

The apparatus accessory unit 16 is located at one end of the second robot movement path, i.e., at an end opposite to the buffer unit 13. The apparatus accessory unit 16 houses a liquid supply unit 16a and a control unit (controller) 16b. The liquid supply unit 16a supplies various treatment liquids (e.g., chemical solution, DIW, etc.) and a volatile solvent (e.g., IPA) to each of the substrate processing units 15. The control unit 16b includes a microcomputer configured to intensively control each unit and a storage configured to store various programs and substrate processing information related to substrate processing (both not illustrated). The control unit 16b controls each unit such as the opening/closing units 11, the first transfer robot 12, the second transfer robot 14, the substrate processing units 15, and the like based on the substrate processing information and various programs.

(Substrate Processing Unit)

Figure 2:
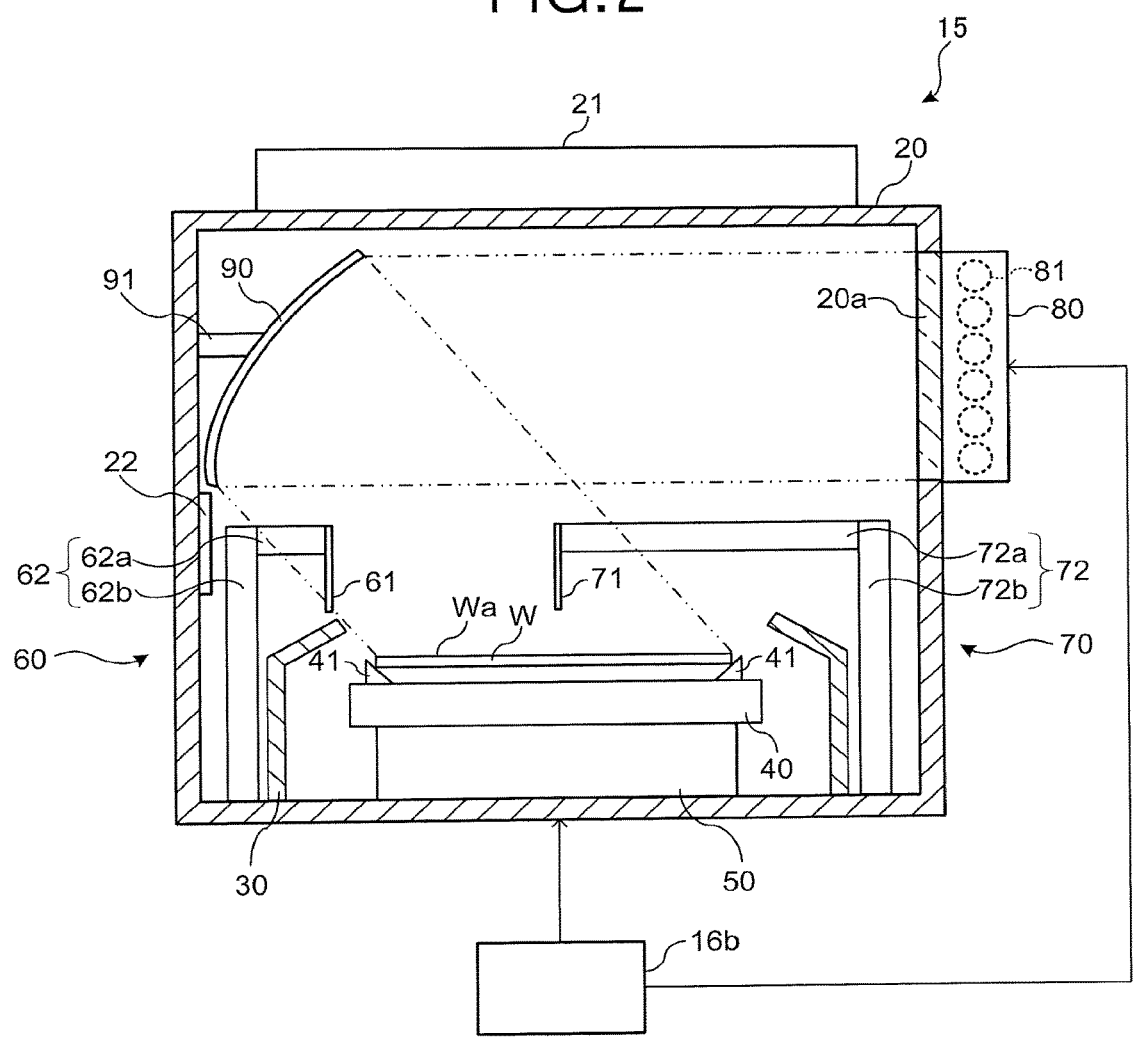
FIG. 2 is a schematic diagram illustrating a configuration of a substrate processing unit of the first embodiment.

As illustrated in FIG. 2, the substrate processing units 15 each include a processing chamber 20, a cup 30, a support part 40, a rotation mechanism 50, a treatment liquid supply part 60, a solvent supply part 70, a heater 80, and an optical member 90.

The processing chamber 20 is a processing box for processing a substrate W having a surface to be treated Wa. The processing chamber 20 is formed in a box shape such as, for example, a rectangular parallelepiped or cube shape, and houses the cup 30, the support part 40, the rotation mechanism 50, and the like. The processing chamber 20 is provided therein with a filter 21 and a shutter 22.

The filter 21 is located on the upper surface of the processing chamber 20, and cleans the outside air to take in the air. As the filter 21, for example, an ULPA filter, a HEPA filter, or the like can be used. The shutter 22 is formed on a side surface of the processing chamber 20 (a side surface on the second robot movement path side in the substrate processing unit 15 illustrated in FIG. 1) so as to be openable and closable. The shutter 22 is opened such that the substrate W can be brought in and out of the processing chamber 20.

The outside air is cleaned by the filter 21 and flows into the processing chamber 20. The air flowing into the processing chamber 20 flows from the top to the bottom. Therefore, downflow (vertical laminar flow) of the clean air is present in the processing chamber 20, and the inside of the processing chamber is kept clean. Besides, an inert gas such as $N_2$ is supplied to the processing chamber 20, and thus the oxygen concentration is suppressed in the processing chamber 20.

The cup 30 is formed in a cylindrical shape, and is located substantially in the center of the inside of the processing chamber 20. The cup 30 is arranged so as to house the support part 40 and the rotation mechanism 50 therein. The upper part of the peripheral wall of the cup 30 is inclined inward to form an opening such that the surface to be treated Wa of the substrate W on the support part 40 is exposed. The cup is configured to receive the treatment liquid scattered from or dropped off the rotating substrate W. A discharge port (not illustrated) is formed in the bottom surface of the cup 30 for discharging the treatment liquid received. A discharge pipe (not illustrated) is connected to the discharge port.

The support part 40 is located substantially at the center in the cup 30 and is arranged on the rotation mechanism 50 so as to be rotatable in a horizontal plane. The support part 40 is called, for example, spin table. The support part 40 has a plurality of support members 41, and supports the substrate W in a horizontal state with the support members 41. The substrate W is supported by the support part 40 such that the center of the surface to be treated Wa is located on the rotation axis of the support part 40, and is rotated within a plane.

The rotation mechanism 50 is arranged so as to hold the support part 40, and is configured to rotate the support part 40 in a horizontal plane. For example, the rotation mechanism 50 has a rotation shaft connected to the center of the support part 40 and a motor for rotating the rotation shaft (both not illustrated). The rotation shaft is driven by the motor to thereby rotate the support part 40. The rotation mechanism 50 is electrically connected to the control unit 16b, and is driven under the control of the control unit 16b.

The treatment liquid supply part 60 includes a first nozzle 61 and a first nozzle moving mechanism 62.

The first nozzle 61 is located above the support part 40 and is configured to be swingable along the surface to be treated Wa of the substrate W on the support part 40 by the first nozzle moving mechanism 62. The first nozzle 61 supplies a treatment liquid (e.g., chemical solution, DIW) from a position facing the center (or near the center) of the surface to be treated Wa of the substrate W on the support part 40 toward the surface to be treated Wa. The first nozzle is supplied with the treatment liquid from the liquid supply unit 16a (see FIG. 1) via piping (not illustrated).

The first nozzle moving mechanism 62 has a movable arm 62a and an arm swinging mechanism 62b. The movable arm 62a holds the first nozzle 61 at one end, and is horizontally supported by the arm swinging mechanism 62b. The arm swinging mechanism 62b holds one end of the movable arm 62a on the side opposite to the first nozzle 61, and swings the movable arm 62a along the surface to be treated Wa of the substrate W on the support part 40. The arm swinging mechanism 62b is electrically connected to the control unit 16b, and is driven under the control of the control unit 16b.

For example, the first nozzle 61 can be moved by the first nozzle moving mechanism 62 between a supply position facing the center of the surface to be treated Wa of the substrate W on the support part 40 and a standby position to which the first nozzle 61 is retracted from above the surface to be treated Wa so that the substrate W can be brought in and out. In FIG. 2, the first nozzle 61 is located at a standby position (a position outside the cup 30) that does not face the surface to be treated Wa of the substrate W on the support part 40.

The solvent supply part 70 includes a second nozzle 71 and a second nozzle moving mechanism 72.

The second nozzle 71 is located above the support part 40 and is configured to be swingable along the surface to be treated Wa of the substrate W on the support part 40 by the second nozzle moving mechanism 72. The second nozzle 71 supplies a volatile solvent (e.g., IPA) from a position facing the center (or near the center) of the surface to be treated Wa of the substrate W on the support part 40 toward the surface to be treated Wa. The volatile solvent is a liquid having a surface tension smaller than that of the treatment liquid (e.g., DIW). The second nozzle 71 is supplied with the volatile solvent from the liquid supply unit 16a (see FIG. 1) via piping (not illustrated).

Similarly to the first nozzle moving mechanism 62, the second nozzle moving mechanism 72 has a movable arm 72a and an arm swinging mechanism 72b. The movable arm 72a holds the second nozzle 71 at one end, and is horizontally supported by the arm swinging mechanism 72b. The arm swinging mechanism 72b holds one end of the movable arm 72a on the side opposite to the second nozzle 71, and swings the movable arm 72a along the surface to be treated Wa of the substrate W on the support part 40. The arm swinging mechanism 72b is electrically connected to the control unit 16b, and is driven under the control of the control unit 16b.

For example, the second nozzle 71 can be moved by the second nozzle moving mechanism 72 between a supply position facing the center of the surface to be treated Wa of the substrate W on the support part 40 and a standby position to which the second nozzle 71 is retracted from above the surface to be treated Wa so that the substrate W can be brought in and out. In FIG. 2, the second nozzle 71 is located at a position facing the center of the surface to be treated Wa of the substrate W on the support part 40.

Examples of the volatile solvent include, in addition to IPA, monovalent alcohols such as ethanol, ethers such as diethyl ether and ethyl methyl ether, ethylene carbonate, and the like.

The heater 80 is arranged on the outer surface of the processing chamber 20 so as not to be above the support part 40 in the processing chamber 20. That is, the processing chamber 20 is provided with the heater 80 on its outer surface on the side opposite to the shutter 22. The heater 80 is formed in, for example, a rectangular parallelepiped shape, and includes a plurality of lamps 81 therein to emit light for heating the substrate W on the support part 40 therefrom. The heating light is light having wavelengths in a predetermined range such as ultraviolet light, visible light, infrared light, and the like. The heater 80 may be provided therein with a reflector. The reflector reflects light not directed toward the processing chamber 20 to guide it toward the processing chamber 20. The reflector is configured to suppress the diffusion of light emitted from each of the lamps 81 such that the light hits the optical member 90 in the processing chamber 20.

Each of the lamps 81 is, for example, a straight tube lamp, and they are arranged to be parallel to one another in a horizontal state. As the lamps 81, for example, halogen lamps or infrared lamps can be used. The heater 80 is electrically connected to the control unit 16b, and is driven under the control of the control unit 16b.

The processing chamber 20 has a transmitting part 20a on its side surface on the side opposite to the shutter 22. The transmitting part 20a is arranged to face the heater 80. The transmitting part 20a is made of a material through which light emitted from the heater 80 passes. Examples of the material include glass, resin, and the like.

The optical member 90 is attached, with a support member 91, to the inside of the processing chamber 20, i.e., an inner surface of the processing chamber 20 on the side opposite to the heater 80 so as not to be above the support part 40 in the processing chamber 20. The support member 91 is fixed to the inner surface of the processing chamber 20 on the side opposite to the heater 80, and holds the optical member 90 at one end thereof. The optical member 90 has a portion having a curved shape (curved portion). The optical member 90 reflects light emitted by the heater 80, and diffuses the light such that the entire surface to be treated Wa of the substrate W on the support part 40 is irradiated with the light. Thus, the light emitted from the heater 80 is guided by the optical member 90 to irradiate the surface to be treated Wa of the substrate W on the support part 40, and thereby the substrate W is heated. Examples of the optical member 90 include a reflection plate, various prisms, and the like. The optical member 90 is larger than the substrate W, and has a circular, rectangular or square shape, or the like.

The control unit 16b controls the rotation of the support part 40 by the rotation mechanism 50, the supply of the treatment liquid by the treatment liquid supply part 60, the supply of the volatile solvent by the solvent supply part 70, heating (irradiation) by the heater 80, and the like based on the substrate processing information and various programs.

(Substrate Processing Step)

In the following, a description will be given of the operation of the substrate processing apparatus 10 for substrate processing. The same substrate processing (chemical treatment, rinsing, and drying) is performed in the processing chamber 20 of each of the substrate processing units 15.

First, the first transfer robot 12 takes out an unprocessed substrate W from the dedicated case in the opening/closing units 11. The first transfer robot 12 moves along the first robot movement path as necessary and stops at a position facing the buffer unit 13. Then, the first transfer robot 12 pivots at the stop position and brings the unprocessed substrate W in the buffer unit 13. Thereby, the unprocessed substrate W is stored in the buffer unit 13.

Thereafter, the second transfer robot 14 takes out the unprocessed substrate W from the buffer unit 13. The second transfer robot 14 moves along the second robot movement path as necessary and stops at a position facing the buffer unit 13. Then, the second transfer robot 14 pivots at the stop position and brings the unprocessed substrate W in the desired one of the substrate processing units 15. Thereby, the unprocessed substrate W is set in the substrate processing unit 15. After that, processing (chemical treatment, rinsing, and drying) is performed on the substrate W in the substrate processing unit 15. Details of the processing in the substrate processing unit 15 will be described later.

Upon completion of the processing in the substrate processing unit 15, the second transfer robot 14 takes out the processed substrate W from the substrate processing unit 15. The second transfer robot 14 moves along the second robot movement path as necessary and stops. Then, the second transfer robot pivots at the stop position and brings the processed substrate W in the buffer unit 13. Thereby, the processed substrate W is stored in the buffer unit 13.

Thereafter, the first transfer robot 12 takes out the processed substrate W from the buffer unit 13. The first transfer robot 12 moves along the first robot movement path as necessary and stops. Then, the first transfer robot 12 pivots at the stop position and brings the processed substrate W in a desired dedicated case. Thereby, the processed substrate W is stored in the dedicated case.

Next, with reference to FIG. 3, the operation of the substrate processing unit 15 for the processing (chemical treatment, rinsing, and drying) will be described. As a preparation, a substrate W is set on the support part 40, and the first nozzle 61 of the treatment liquid supply part 60 is arranged at a position facing the center of the surface to be treated Wa of the substrate W on the support part 40. Processing conditions such as the rotational speed of the substrate W and the supply time of the liquid are set in advance in the control unit 16b; however, they can be arbitrarily changed by the operator.

Figure 3:
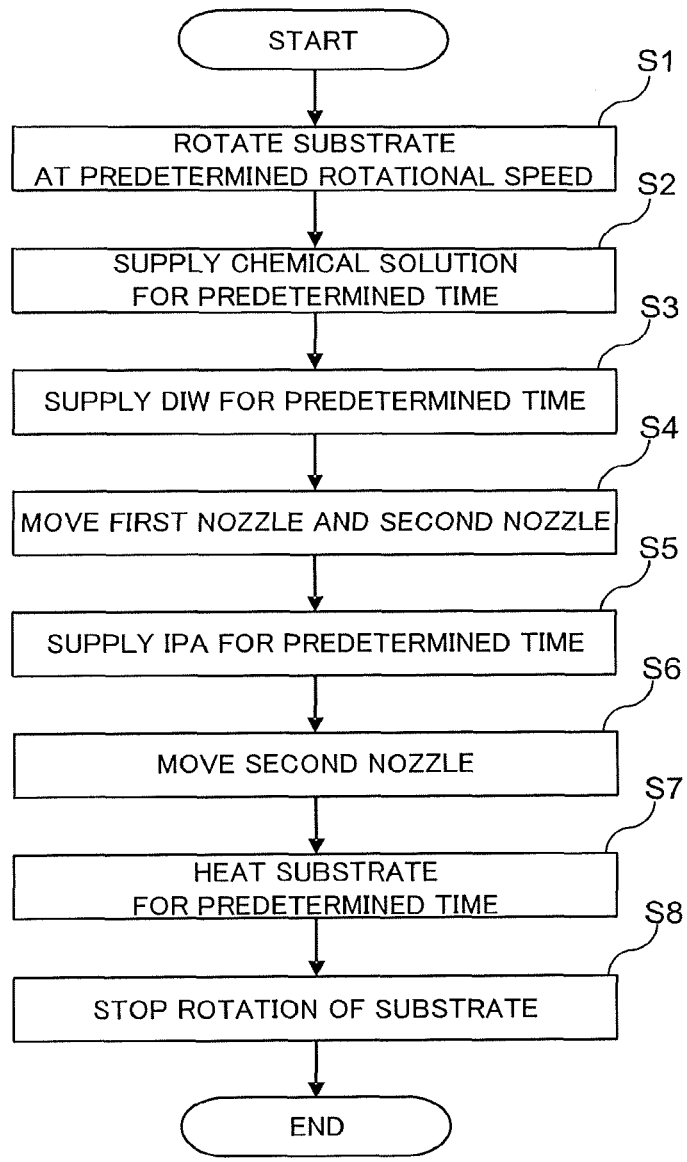
FIG. 3 is a flowchart illustrating substrate processing performed by the substrate processing unit according to the first embodiment.

As illustrated in FIG. 3, in step S1, the rotation mechanism 50 rotates the substrate W on the support part 40 at a predetermined rotational speed by the rotation of the support part 40. The rotational speed of the substrate W is set in advance in the control unit 16b such that a predetermined amount of a liquid such as a chemical solution, DIW, IPA or the like (described later) supplied to the surface to be treated Wa of the substrate W has a desired film thickness.

In step S2, the treatment liquid supply part 60 supplies a chemical solution from the first nozzle 61 to the center of the surface to be treated Wa of the substrate W on the rotating support part 40 for a predetermined time, and stops the supply of the chemical solution when a predetermined time has elapsed. The chemical solution is supplied from the first nozzle 61 to the center of the surface to be treated Wa of the substrate W on the rotating support part 40 and spreads over the entire surface to be treated Wa by the centrifugal force due to the rotation of the substrate W. Thereby, a liquid film of the chemical solution is formed on the surface to be treated Wa of the substrate W on the support part 40. Thus, the surface to be treated Wa of the substrate W is covered with the liquid film of the chemical solution and treated with the chemical solution.

In step S3, after stopping the supply of the chemical solution, the treatment liquid supply part 60 supplies DIW from the first nozzle 61 to the center of the surface to be treated Wa of the substrate W on the rotating support part 40 for a predetermined time, and stops the supply of DIW when a predetermined time has elapsed. DIW is supplied from the first nozzle 61 to the center of the surface to be treated Wa of the substrate W on the rotating support part 40 and spreads over the entire surface to be treated Wa by the centrifugal force due to the rotation of the substrate W. The chemical solution is swept from the surface to be treated Wa of the substrate W by the supplied DIW, resulting in that the surface to be treated Wa is covered with a liquid film of DIW. Thereby, a liquid film of DIW is formed on the surface to be treated Wa of the substrate W. Thus, the surface to be treated Wa of the substrate W is covered with the liquid film of DIW and rinsed.

In step S4, after stopping the supply of DIW, the first nozzle moving mechanism 62 moves the first nozzle 61 from the supply position facing the center of the surface to be treated Wa of the substrate W on the support part 40 to the standby position that does not face the surface to be treated Wa. Besides, after stopping the supply of DIW, the second nozzle moving mechanism 72 moves the second nozzle 71 from the standby position that does not face the surface to be treated Wa of the substrate W on the support part 40 to the supply position facing the center of the surface to be treated Wa.

In step S5, after completion of the movement of the first nozzle 61 and the second nozzle 71, the solvent supply part 70 supplies IPA (an example of the volatile solvent) from the second nozzle 71 to the center of the surface to be treated Wa of the substrate W on the rotating support part 40 for a predetermined time, and stops the supply of IPA when a predetermined time has elapsed. The supply of IPA is performed before DIW dries. IPA is supplied from the second nozzle 71 to the center of the surface to be treated Wa of the substrate W on the rotating support part 40 and spreads over the entire surface to be treated Wa by the centrifugal force due to the rotation of the substrate W. As a result, DIW on the surface to be treated Wa of the substrate W is replaced by IPA, and a liquid film of IPA is formed on the surface to be treated Wa.

When the supply of IPA is stopped, IPA is thrown from the surface to be treated Wa of the substrate W by the centrifugal force due to the rotation of the substrate W, and the thickness of the liquid film gradually decreases. However, the liquid film is maintained on the surface to be treated Wa of the substrate W such that its thickness does not become a predetermined value or less until the heating start time at which the heater 80 starts heating the substrate W by irradiating light to the surface to be treated Wa of the substrate W on the support part 40. In other words, the surface to be treated Wa of the substrate W is covered with the liquid film during each liquid treatment until the heating step. If the surface to be treated Wa of the substrate W is naturally dried before the heating step, it does not dry uniformly, resulting in a drying failure such as watermark. Therefore, the surface to be treated Wa of the substrate W is kept wet during each liquid treatment until the heating step to suppress the occurrence of a drying failure.

In step S6, after stopping the supply of IPA, the second nozzle moving mechanism 72 moves the second nozzle 71 from the supply position facing the center of the surface to be treated Wa of the substrate W on the support part 40 to the standby position that does not face the surface to be treated Wa. With this, in step S7 (described later), the second nozzle 71 and the movable arm 72a of the second nozzle moving mechanism 72 are prevented from blocking the light guided to the entire surface to be treated Wa of the substrate W on the support part 40 by the optical member 90. Thus, the surface to be treated Wa of the substrate W on the support part 40 can be uniformly heated. However, since the light goes around an object, the step S6 can be omitted depending on the thickness of the movable arm 72a, the thickness of the second nozzle 71, the amount of light irradiated, or the like. In addition, the step S6 may also be omitted if the movable arm 72a is made of a material that does not absorb light.

In step S7, after completion of the movement of the second nozzle 71, the heater 80 turns on the lamps to heat the substrate W on the rotating support part 40 for a predetermined time, and turns off the lamps 81 when a predetermined time has elapsed. The light emitted from the heater 80 is guided by the optical member 90 to irradiate the entire surface to be treated Wa of the substrate W on the support part 40, and thereby the substrate W is heated. As a result, the surface to be treated Wa of the substrate W dries instantaneously. While the heating of the heater 80 by irradiation is described as being started after completion of the movement of the second nozzle 71, it is not so limited. For example, the heating may be started when the supply of IPA is stopped or while IPA is being supplied.

Although the light emitted by the heater 80 diffuses in some degree, it hits the optical member 90. The light reflected by the optical member 90 diffuses more than the light emitted from the heater 80. This is because the optical member 90 is curved. The light diffused from the optical member 90 is adjusted to be in a range in which it can heat the entire surface to be treated Wa of the substrate W on the support part 40. Note that the optical member 90 need not necessarily be curved as long as the light can be guided to the entire surface to be treated Wa of the substrate W.

In step S8, after the lamps 81 are turned off, the rotation mechanism 50 stops the rotation of the substrate W. Thereafter, the processed substrate W is taken out from the support part 40 and transferred. At this time, the shutter 22 of the processing chamber 20 is opened, and a part of the second transfer robot 14 (hand, arm, etc.) enters the inside from the opening of the processing chamber 20 to take out the processed substrate W.

In such a substrate processing step, in step 7, the light emitted from the heater 80 is guided by the optical member 90 to irradiate the entire surface to be treated Wa of the substrate W on the support part 40, and the substrate W is heated. With this, the liquid is vaporized around a pattern on the surface to be treated Wa of the substrate W. As a result, the surface to be treated Wa of the substrate W dries instantaneously. At this time, the heater 80 instantaneously heats only the substrate W such that an air layer is formed on the surface to be treated Wa of the substrate W, which has been supplied with the liquid, to make the liquid into a liquid ball (to generate a droplet of the liquid). When the substrate W is instantaneously heated by the heater 80, the liquid in contact with the pattern on the surface to be treated Wa of the substrate W starts vaporizing earlier than the liquid in the other portions. Thereby, a layer of gas, i.e., a gas layer is formed as a thin film around the pattern on the surface to be treated Wa of the substrate W due to evaporation of the liquid. Accordingly, the liquid between adjacent patterns is pushed out therefrom by the gas layer, and the drying proceeds.

In other words, by instantaneously heating the substrate W as described above, the liquid in contact with the pattern on the surface to be treated Wa of the substrate W is instantaneously vaporized, and the liquid in the other portions on the surface to be treated Wa immediately turns into a liquid ball (liquid ball phenomenon). Each of liquid balls on the surface to be treated Wa is thrown off the substrate W by the centrifugal force due to the rotation of the substrate W, and the substrate W dries quickly. Thus, it is possible to suppress the liquid from remaining between some patterns. This achieves a uniform drying rate of the liquid on the surface to be treated Wa of the substrate W. Thus, the pattern can be prevented from collapsing due to a collapsing force (e.g., surface tension, etc.) caused by the remaining liquid.

Incidentally, the heater 80 can heat the surface to be treated Wa of the substrate W to the Leidenfrost temperature (the temperature at which the Leidenfrost effect, i.e., the liquid ball phenomenon occurs) or higher rapidly (e.g., within a range of several seconds to several tens of seconds). With this, the heater 80 can rapidly heat the substrate W on the support part 40 to the Leidenfrost temperature or higher, thereby making the treatment liquid on the surface to be treated Wa of the substrate W into a liquid ball. In order to reliably make the treatment liquid on the surface to be treated Wa of the substrate W into a liquid ball, it is preferable to heat only the substrate W without heating the volatile solvent (e.g., IPA). Therefore, it is preferable to use the heater 80 that emits light not absorbed by the volatile solvent.

On the other hand, when the drying is performed without using the heater 80, the liquid does not dry uniformly in the course of drying of the liquid. As a result, the liquid remains between some patterns, and the pattern collapses due to a collapsing force (surface tension) caused by the remaining liquid. For example, patterns have a width of 20 nm and a height of 200 nm (the height is 10 times bigger than the width). Since the patterns are fine, the liquid in a gap between the patterns is difficult to dry. Therefore, even after the other portions have dried, the liquid remains between some of the patterns, and the patterns may collapse due to a collapsing force caused by the liquid.

In the substrate processing units 15, the heater 80 and the optical member 90 are arranged so as not to be above the support part 40, and are not located above the surface to be treated Wa of the substrate W on the support part 40. That is, the heater 80 is located outside the processing chamber 20. Therefore, a mist or particles of the treatment liquid can be prevented from adhering to the surface of the heater 80 during the processing in the processing chamber 20. As a result, the surface to be treated Wa of the substrate W on the support part 40 can be prevented from being contaminated with the adhering matter having dropped from the surface of the heater 80. Thus, the contamination of the substrate W can be suppressed. In addition, since the heater 80 is located outside the processing chamber 20, maintenance work for the heater 80 can be easily performed.

Moreover, since the heater 80 is located outside the processing chamber 20, each heating process performed by the heater 80 does not raise the temperature in the processing chamber 20. Thus, the temperature in the processing chamber 20 is prevented from becoming too high. Accordingly, it is not required to wait until the temperature drops inside the processing chamber 20 before bringing in the unprocessed substrate W. If the process is performed when the temperature is high in the processing chamber 20, the liquid supplied to the surface to be treated Wa of the substrate W does not dry uniformly. This may result in a drying failure such as drying unevenness.

Further, the optical member 90 is not located above the surface to be treated Wa of the substrate W on the support part 40. Therefore, even if a mist or particles of the treatment liquid adhere(s) to the surface of the optical member 90 in the processing chamber 20 and drops therefrom at some timing, it does not adhere to the surface to be treated Wa of the substrate W on the support part 40. As a result, the contamination of the substrate W can be suppressed.

Still further, since the heater 80 and the optical member 90 are not located above the surface to be treated Wa of the substrate W on the support part 40, the flow of clean air from the filter 21 toward the surface to be treated Wa is not interrupted by the heater 80 and the optical member 90, and is sufficiently supplied to the surface to be treated Wa. Thereby, particles can be easily removed from the surface to be treated Wa of the substrate W and its surroundings. Thus, the contamination of the substrate W can be suppressed.

Since the optical member 90 is used to guide the light emitted from the heater 80 to the entire surface to be treated Wa of the substrate W on the support part 40, the heater 80 can be arranged, for example, outside the processing chamber 20 so as not to be above the support part 40. In this manner, the degree of freedom can be improved in the installation of the heater 80. In addition, the use of the optical member 90 eliminates the need of inclining the rectangular parallelepiped heater 80 to be installed. Thus, it is possible to suppress an increase in the size of the apparatus.

As described above, according to the first embodiment, the heater 80 is arranged so as not to be above the support part 40, i.e., outside the processing chamber 20, and the optical member 90, which guides the light emitted by the heater 80 to the surface to be treated Wa of the substrate W on the support part 40, is arranged on the side opposite to the heater 80 with respect to the support part 40. This prevents a mist or particles of the treatment liquid from adhering to the surface of the heater 80 during the processing in the processing chamber 20. That is, since the heater 80 is not located above the surface to be treated Wa of the substrate W on the support part 40, the surface to be treated Wa can be prevented from being contaminated with the adhering matter having dropped from the surface of the heater 80. Thus, the contamination of the substrate W can be suppressed. Further, the flow of clean air from the filter 21 toward the surface to be treated Wa of the substrate W is not interrupted by the heater 80, and is sufficiently supplied to the surface to be treated Wa. Thereby, particles can be easily removed from the surface to be treated Wa of the substrate W and its surroundings. Thus, the contamination of the substrate W can be suppressed.

Further, the optical member 90 is arranged in the processing chamber 20 so as not to be above the support part 40. Accordingly, the optical member 90 is not located above the surface to be treated Wa of the substrate W on the support part 40. Therefore, even if a mist or particles of the treatment liquid adhere(s) to the surface of the optical member 90 in the processing chamber 20 and drops therefrom at some timing, it does not adhere to the surface to be treated Wa of the substrate W on the support part 40. Thus, the contamination of the substrate W can be suppressed. Further, the flow of clean air from the filter 21 toward the surface to be treated Wa of the substrate W is not interrupted by the optical member 90, and is sufficiently supplied to the surface to be treated Wa. Thereby, particles can be easily removed from the surface to be treated Wa of the substrate W and its surroundings. Thus, the contamination of the substrate W can be reliably suppressed.

<Second Embodiment>

A second embodiment will be described with reference to FIGS. 4 and 5. In the second embodiment, differences from the first embodiment (sharing of heaters by two adjacent substrate processing units) will be described, and the same description will not be repeated.

Figure 4:
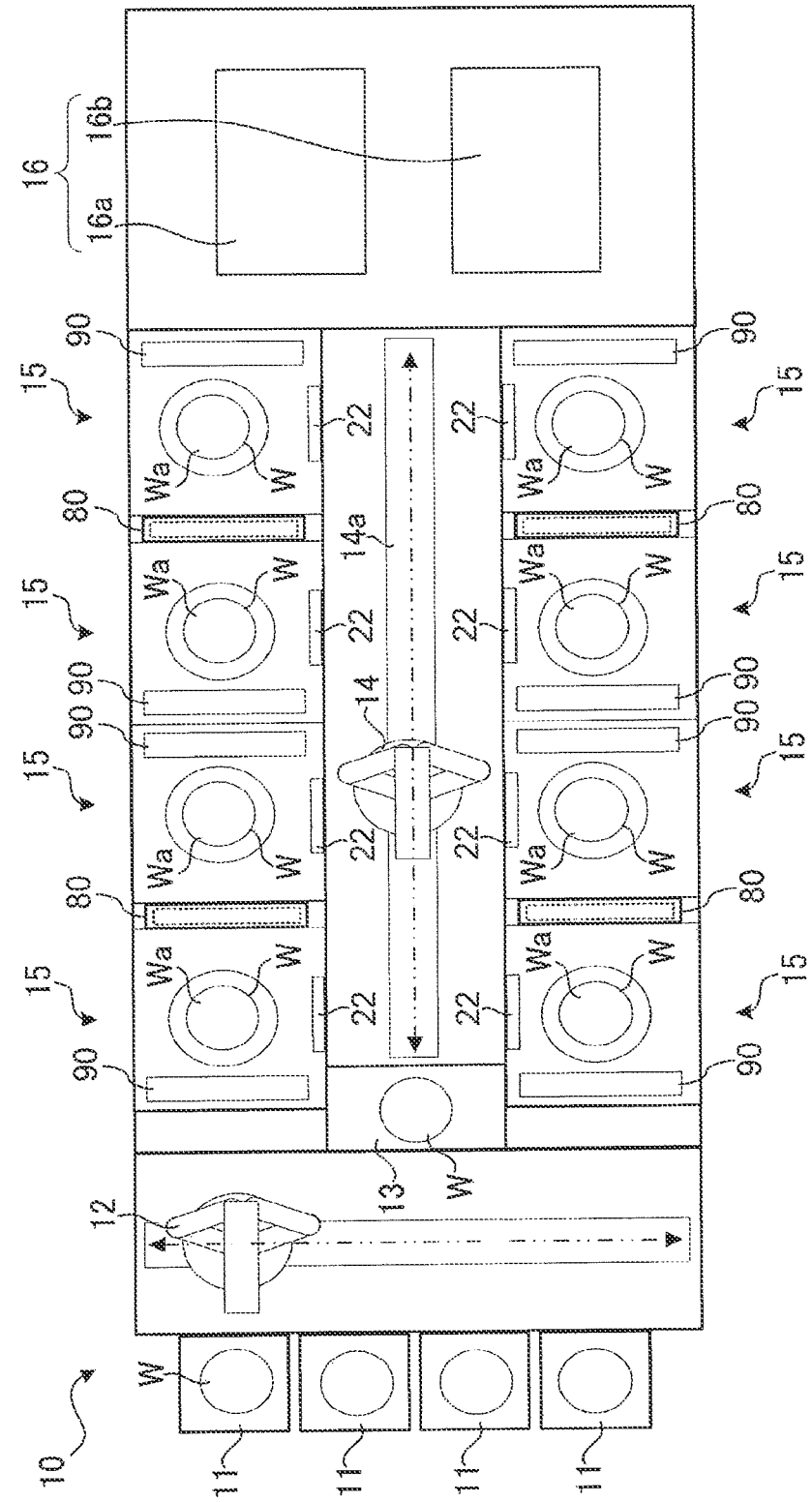
FIG. 4 is a schematic diagram illustrating a configuration of a substrate processing apparatus according to a second embodiment.
Figure 5:
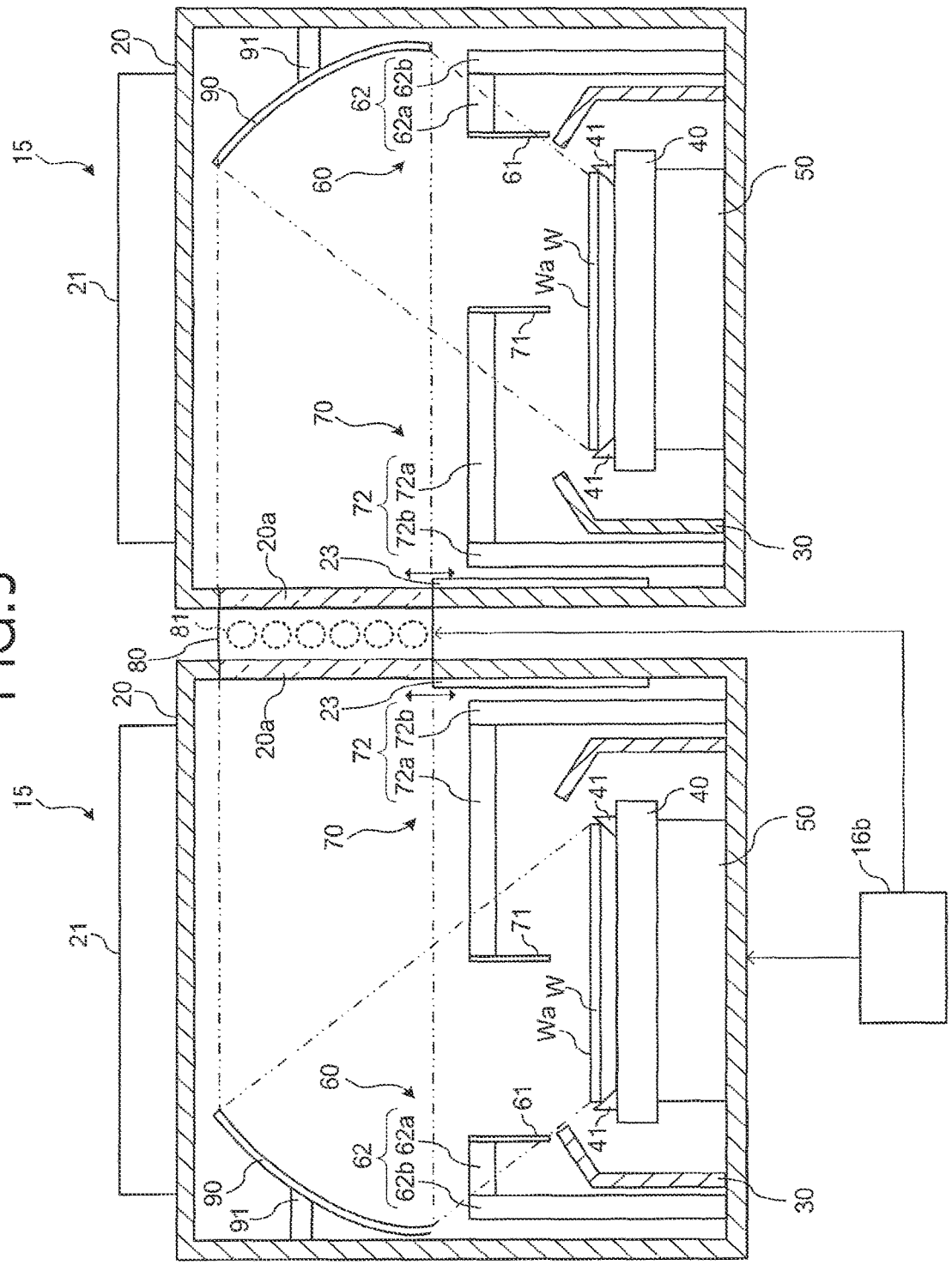
FIG. 5 is a schematic diagram illustrating a configuration of two adjacent substrate processing units of the second embodiment.

As illustrated in FIGS. 4 and 5, in the substrate processing apparatus 10 of the second embodiment, an adjacent couple of the substrate processing units 15 share one heater 80. The heater 80 is arranged between the adjacent substrate processing units 15.

As illustrated in FIG. 5, one heater 80 is located between the respective transmitting parts 20*a* of an adjacent couple of the processing chambers 20. That is, the transmitting parts 20*a* of the two adjacent processing chambers 20 are formed so as to sandwich the heater 80 therebetween. The heater 80 emits light to the optical member 90 in each of the two adjacent processing chambers 20 via the transmitting part 20*a*. The light emitted from the heater 80 is guided by the optical member 90 to irradiate the entire surface to be treated Wa of the substrate W on the support part 40 in each of the two adjacent processing chambers 20. Thereby, the substrate W on the support part 40 is heated.

Each of the processing chambers 20 is provided with a light blocking member 23. The light blocking member 23 is configured to be movable in the vertical direction by a moving mechanism (not illustrated), and functions as a shutter. For example, the light blocking member 23 can be moved between a light blocking position facing the heater 80 where it blocks the light emitted from the heater 80 and a standby position not facing the heater 80 where it does not block the light emitted from the heater 80. In the example of FIG. 5, the light blocking member 23 is located in the standby position.

As the light blocking member 23, for example, a shield plate or a reflection plate can be used. When a reflection plate is used, the reflection plate reflects the light to the heater 80 side at the light blocking position. Therefore, the light blocking member 23 functions as a reflector that reflects the light emitted from each of the lamps 81, and reflects the light emitted from each of the lamps 81 to guide it to the processing chamber 20 side where the heating process is performed.

Examples of the moving mechanism of the light blocking member 23 include various types of moving mechanisms such as a linear motor moving mechanism and a feed screw moving mechanism. The moving mechanism of the light blocking member 23 is electrically connected to the control unit 16*b*, and is driven under the control of the control unit 16*b*.

When the heating process of the heater 80 is performed simultaneously in the two adjacent processing chambers 20, the light blocking member 23 is moved to the standby position in each of them. However, in some cases, the heating process of the heater 80 is not performed at the same time. In this case, only the light blocking member 23 in the processing chamber 20, in which the heating process of the heater 80 is not performed, moves to the light blocking position. The control unit 16*b* controls the movement of the light blocking member 23.

As described above, according to the second embodiment, it is possible to achieve the same effects as those of the first embodiment. In addition, one heater 80 is shared by two adjacent processing chambers 20. Thereby, the apparatus configuration can be simplified. Further, by the use of the light blocking member 23, even when the heating process is not performed simultaneously in the two adjacent processing chambers 20, one heater 80 can be shared between the chambers.

In the second embodiment, an example is described in which one heater 80 is shared by two adjacent processing chambers 20; however, it is not so limited. For example, one heater 80 may be shared by three or more processing chambers 20. In this case, an optical member such as a reflection plate and a prism may be further provided as required.

<Third Embodiment>

A third embodiment will be described with reference to FIG. 6. In the third embodiment, differences (optical member moving mechanism) from the first embodiment will be described, and the same description will not be repeated.

As illustrated in FIG. 6, in the third embodiment, an optical member moving mechanism 92 is provided. The optical member moving mechanism 92 is a vertical moving mechanism (lifting mechanism), which holds one end of the support member 91, i.e., one end of the support member 91 on the side opposite to the optical member 90, and moves the optical member 90 in the vertical direction. This enables the irradiation region irradiated by the optical member 90 to be moved on the surface to be treated Wa of the substrate W on the support part 40. Examples of the vertical moving mechanism include various types of moving mechanisms such as a linear motor moving mechanism and a feed screw moving mechanism. The optical member moving mechanism 92 is electrically connected to the control unit 16b (see FIG. 2), and is driven under the control of the control unit 16b.

The size of the optical member 90 of the third embodiment is smaller than that of the optical member of the first embodiment. The optical member 90 of the first embodiment guides the light emitted by the heater 80 to irradiate the entire surface to be treated Wa of the substrate W on the support part 40. On the other hand, the optical member 90 of the third embodiment guides the light emitted by the heater 80 to irradiate a part of the surface to be treated Wa of the substrate W on the support part 40. Similarly to the optical member 90 of first embodiment, the optical member 90 of the third embodiment has a circular, rectangular or square shape, or the like, and has a curved portion.

In such a configuration, the optical member moving mechanism 92 moves the optical member 90 in the vertical direction during the heating process by the heater 80 (see step S7 in FIG. 3). The light emitted by the heater 80 is guided by the optical member 90 to irradiate a part of the surface to be treated Wa of the substrate W on the support part 40. Along with the movement of the optical member 90 in the vertical direction, the irradiation region on the surface to be treated Wa moves from end to end of the surface to be treated Wa of the substrate W on the support part 40 in the diameter direction. At this time, the substrate W is rotating, and the entire surface to be treated Wa of the substrate W is irradiated with the light. Thereby, the substrate W on the support part 40 is heated. The optical member moving mechanism 92 is configured to move the optical member 90 so as to irradiate the light from end to end (or from end to center) of the surface to be treated Wa of the substrate W on the support part 40 in the diameter direction.

As described above, according to the third embodiment, it is possible to achieve the same effects as those of the first embodiment. Besides, the optical member moving mechanism 92 is provided. Thereby, even if the optical member 90 is miniaturized, the light can be irradiated to the entire surface to be treated Wa of the substrate W on the support part 40 by moving the optical member 90 with the optical member moving mechanism 92. Thus, the miniaturization of the optical member 90 can be realized.

In the third embodiment, the optical member 90 is described as being moved in the vertical direction; however, it is not so limited. For example, the optical member 90 may be moved in the front-back direction or the left-right direction, rotated, or eccentrically rotated. In the case of rotation and eccentric rotation, when the rotation direction of the optical member 90 is the same as that of the substrate W on the support part 40, they have to be rotated at different rotational speeds. Further, the optical member 90 may be rotated in a direction opposite to the rotation direction of the substrate W on the support part 40.

Besides, in the vertical movement, the movement range of the optical member 90 by the optical member moving mechanism 92 may be increased. With this, for example, when the heating process of the heater 80 is not performed, the optical member 90 can be moved to a position lower than the surface to be treated Wa of the substrate W on the support part 40 to stand by. In this case, a mist of the chemical solution can be suppressed from adhering to the optical member 90 during the process other than the heating process, for example, during the chemical treatment. Thus, the contamination of the optical member 90 can be suppressed.

<Fourth Embodiment>

A fourth embodiment will be described with reference to FIG. 7. In the fourth embodiment, differences (optical member moving mechanism) from the third embodiment will be described, and the same description will not be repeated.

As illustrated in FIG. 7, in the fourth embodiment, an optical member moving mechanism 93 is provided. The optical member moving mechanism 93 is a swing mechanism, and is arranged at one end of the support member 91, i.e., one end of the support member on the optical member 90 side. The optical member moving mechanism 93 holds the optical member 90 and swings the optical member 90 (the optical member 90 has the same size and shape as described in the third embodiment) about the holding point as the rotation center. This enables the irradiation region irradiated by the optical member 90 to be moved on the surface to be treated Wa of the substrate W on the support part 40. The swing mechanism includes, for example, a motor (not illustrated) capable of changing the rotation direction, and swings the optical member 90 by the rotation of the motor. The optical member moving mechanism 93 is electrically connected to the control unit 16b (see FIG. 2), and is driven under the control of the control unit 16b.

In such a configuration, the optical member moving mechanism 93 swings the optical member 90 during the heating process by the heater 80 (see step S7 in FIG. 3). The light emitted by the heater 80 is guided by the optical member 90 to irradiate a part of the surface to be treated Wa of the substrate W on the support part 40. Along with the swinging of the optical member 90, the irradiation region on the surface to be treated Wa moves from end to end of the surface to be treated Wa of the substrate W on the support part 40 in the diameter direction. At this time, the substrate W is rotating, and the entire surface to be treated Wa of the substrate W is irradiated with the light. Thereby, the substrate W on the support part 40 is heated. The optical member moving mechanism 93 is configured to move the optical member 90 so as to irradiate the light from end to end (or from end to center) of the surface to be treated Wa of the substrate W on the support part 40 in the diameter direction.

As described above, according to the fourth embodiment, it is possible to achieve the same effects as those of the first embodiment and further to achieve the same effects as in the third embodiment.

In the fourth embodiment, the optical member 90 is describes as being swung; however, it is not so limited. As in the third embodiment, for example, the optical member 90 may be moved in the front-back direction or the left-right direction, rotated, or eccentrically rotated.

<Fifth Embodiment>

A fifth embodiment will be described with reference to FIG. 8. In the fifth embodiment, differences (cleaning unit) from the first embodiment will be described, and the same description will not be repeated.

As illustrated in FIG. 8, in the fifth embodiment, a cleaning unit 94 is provided. The cleaning unit 94 is located at, for example, the upper end portion of the optical member 90, and flows a fluid along the surface of the optical member 90 to clean the optical member 90. Examples of the fluid include a liquid (e.g., DIW) or a gas (e.g., an inert gas). The cleaning unit 94 is electrically connected to the control unit 16b (see FIG. 2), and is driven under the control of the control unit 16b. Incidentally, the cleaning unit 94 is connected to a fluid supply unit (not illustrated) for supplying the fluid.

In such a configuration, the cleaning unit 94 ejects a fluid such that the fluid flows along the surface of the optical member 90 during a maintenance period or a standby period in which the substrate processing is not performed. As the fluid flows along the surface of the optical member 90, extraneous matter adhering to the surface of the optical member 90 is removed. The extraneous matter is, for example, a mist or particles of the treatment liquid having adhered to the surface of the optical member 90 during the processing in the processing chamber 20.

As described above, according to the fifth embodiment, it is possible to achieve the same effects as those of the first embodiment. Further, with the cleaning unit 94, extraneous matter adhering to the surface of the optical member 90 can be removed. Thus, the contamination of the optical member 90 can be suppressed.

In the fifth embodiment, the cleaning unit 94 is described as being located at the upper end portion of the optical member 90; however, it is not so limited. The cleaning unit 94 may be located in any position as long as it can clean the optical member 90. Alternatively, the optical member 90 may be moved to a predetermined cleaning position (standby position) to clean it in the cleaning position.

In addition, although the fluid is made to flow along the surface of the optical member 90, it is not so limited. The fluid may be sprayed to the surface of the optical member 90. Alternatively, instead of the fluid, the surface of the optical member 90 may be wiped with a contact member (e.g., cloth or sponge). Besides, after the surface of the optical member 90 is cleaned with a liquid, the surface of the optical member 90 may be dried with a gas blown against the surface or light irradiated from the heater 80 thereto.

<Sixth Embodiment>

A sixth embodiment will be described with reference to FIG. 9. In the sixth embodiment, differences (light amount suppressing member) from the first embodiment will be described, and the same description will not be repeated.

As illustrated in FIG. 9, in the sixth embodiment, a light amount suppressing member 21a is provided. The light amount suppressing member 21a is arranged on the upper surface (ceiling) of the processing chamber 20 at a position on the heater 80 side so as not to obstruct the air having passed through the filter 21. The light amount suppressing member 21a is configured to suppress the light emitted by the heater 80 from entering the filter 21, i.e., suppress the amount of light to be incident on the filter 21. As the light amount suppressing member 21a, for example, a plate made of a metal or a resin can be used, and it may be a plate that does not transmit light or a mesh plate. A plate that completely blocks light may also be used such that the amount of light incident on the filter 21 is 0 (zero).

In such a configuration, part or all of the light emitted by the heater 80 toward the filter 21 is blocked by the light amount suppressing member 21a during the heating process by the heater 80 (see step S7 in FIG. 3). This suppresses the amount of light incident on the filter 21. Thereby, it is possible to reduce the deterioration or damage of the filter 21 due to the heat of the light. Thus, the performance of the filter 21 can be maintained, and the time for replacement of the filter 21 can be deferred.

(Modification of the Light Amount Suppressing Member)

Next, a modification of the above-described light amount suppressing member 21a, i.e., a light amount suppressing member 21b, will be described with reference to FIG. 10.

Figure 10:
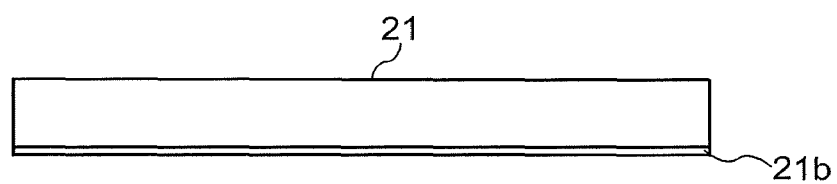
FIG. 10 is a schematic diagram illustrating a light amount suppressing member according to a modification of the sixth embodiment.

As illustrated in FIG. 10, the light amount suppressing member 21b is arranged on the lower surface of the filter 21 (a surface of the filter 21 on the processing chamber 20 side: see FIG. 9) to cover the entire lower surface. The light amount suppressing member 21b is formed of, for example, a mesh plate or a plate having a plurality of holes so that air can pass therethrough. Accordingly, the air having passed through the filter 21 can pass through the light amount suppressing member 21b.

In such a configuration, part or all of the light emitted by the heater 80 toward the filter 21 is blocked by the light amount suppressing member 21b during the heating process by the heater 80 (see step S7 in FIG. 3). This suppresses the amount of light incident on the filter 21. Thereby, it is possible to reduce the deterioration or damage of the filter 21 due to the heat of the light. Thus, the performance of the filter 21 can be maintained, and the time for replacement of the filter 21 can be deferred.

As described above, according to the sixth embodiment, it is possible to achieve the same effects as those of the first embodiment. In addition, with the light amount suppressing member 21a or 21b, the amount of light incident on the filter 21 can be suppressed. Thereby, it is possible to reduce the deterioration or damage of the filter 21 due to the heat of the light. Thus, the performance of the filter 21 can be maintained, and the lifetime of the filter 21 can be deferred.

<Other Embodiments>

In the above embodiments, the heater 80 is described as being located outside the processing chamber 20; however, it is not so limited. For example, the heater 80 may be arranged in the processing chamber 20 so as not to be above the support part 40. In this case, there may be provided a cleaning unit for cleaning the heater 80. There may also be provided a moving mechanism for moving the heater 80. For example, when the heating process of the heater 80 is not performed, the heater 80 may be moved to a position lower than the surface to be treated Wa of the substrate W on the support part 40 to stand by.

In the above embodiments, an example is described in which the heater 80 is located outside the processing chamber 20 on the side surface (outer surface) of the processing chamber 20; however, it is not so limited. For example, the heater 80 may be located outside the processing chamber 20 on the bottom of the processing chamber 20. In this case, an optical member such as a reflection plate or a prism is further arranged to guide the light from the heater to the optical member 90 in the processing chamber 20. The heater 80 may also be located on the lower side of the outer side surface of the processing chamber 20. An optical member such as a reflection plate or a prism may be further arranged in this case as well.

In the above embodiments, an example is described in which the optical member 90 is arranged in the processing chamber 20 so as not to be above the support part 40;

however, it is not so limited. For example, the optical member 90 may be located outside the processing chamber 20, and the processing chamber may be provided with a transmitting part for the optical member 90. In this case, a mist or particles of the treatment liquid can be prevented from adhering to the optical member 90 during the processing in the processing chamber 20. Thus, the contamination of the optical member 90 can be reliably suppressed.

In the above embodiments, the heater 80 is used in the drying process; however, it is not so limited. The heater 80 may be used in the chemical treatment process using sulfuric acid, phosphoric acid, or the like as a chemical solution to heat the sulfuric acid or the phosphoric acid supplied to the surface to be treated Wa of the substrate W on the support part 40 to a high temperature of, for example, 150° C. or more. In this case, when the treatment liquid absorbs light, the treatment liquid itself is also heated by light.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus, comprising:
    a processing chamber provided therein with a support part configured to support a substrate having a surface to be treated, the processing chamber being configured such that air flows from above to the surface to be treated of the substrate supported by the support part;
    a heater arranged so as not to be above the support part and configured to emit light for heating; and
    an optical member arranged in the processing chamber so as not to be above the support part and configured to guide the light emitted by the heater and having passed above the support part to the surface to be treated of the substrate supported by the support part.

2. The substrate processing apparatus of claim 1, further comprising an optical member moving mechanism configured to move the optical member.

3. The substrate processing apparatus of claim 1, further comprising a cleaning unit configured to clean the optical member.

4. The substrate processing apparatus of claim 1, wherein the heater is located outside the processing chamber.

5. The substrate processing apparatus of claim 4, wherein the heater is located on a side surface of the processing chamber.

6. The substrate processing apparatus of claim 1, further comprising:
    a filter located on an upper surface of the processing chamber to take clean air into the processing chamber; and
    a light amount suppressing member configured to suppress the amount of the light emitted by the heater incident on the filter.

7. The substrate processing apparatus of claim 1, wherein the processing chamber includes a plurality of processing chambers, and
    the heater is shared by the processing chambers.

8. The substrate processing apparatus of claim 7, further comprising a plurality of light blocking members each arranged in one of the plurality of processing chambers and configured to be movable to a position for blocking the light emitted by the heater and traveling toward the optical member.

9. The substrate processing apparatus of claim 3, wherein the cleaning unit is arranged an upper end portion of the optical member and configured to flow a fluid along a surface of the optical member.

10. The substrate processing apparatus of claim 5, further comprising a transmitting part which is arranged on the side surface of the processing chamber where the heater is located so as to face the heater, and through which the light emitted from the heater passes.

11. The substrate processing apparatus of claim 5, further comprising a shutter on a side surface of the processing chamber on an opposite side to the side surface where the heater is located, wherein the shutter is configured to allow the substrate to be brought in the processing chamber.

12. The substrate processing apparatus of claim 6, wherein the light amount suppressing member is a mesh plate or a plate having a plurality of holes.

13. The substrate processing apparatus of claim 7, wherein
    an adjacent pair of the processing chambers are each provided with a transmitting part through which the light emitted from the shared heater passes, and
    the heater is located between the transmitting part of one of the processing chambers and the transmitting part of the other.

* * * * *